(12) United States Patent
He et al.

(10) Patent No.: US 8,675,319 B2
(45) Date of Patent: Mar. 18, 2014

(54) DATA READER WITH HEUSLER ALLOY REFERENCE LAMINATION

(75) Inventors: Qing He, Plymouth, MN (US); Konstantin Nikolaev, Edina, MN (US); Hao Meng, Singapore (SG); Yonghua Chen, Edina, MN (US); Juren Ding, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/556,983

(22) Filed: Jul. 24, 2012

(65) Prior Publication Data
US 2012/0295131 A1 Nov. 22, 2012

Related U.S. Application Data

(62) Division of application No. 12/706,644, filed on Feb. 16, 2010, now abandoned.

(51) Int. Cl.
*G11B 5/39* (2006.01)
(52) U.S. Cl.
USPC .......................................... 360/324.11
(58) Field of Classification Search
USPC .......................................... 360/324.11
See application file for complete search history.

(56) References Cited

U.S. PATENT DOCUMENTS

| | | | |
|---|---|---|---|
| 2002/0150675 A1* | 10/2002 | Everitt et al. | 427/128 |
| 2003/0137785 A1* | 7/2003 | Saito | 360/324.11 |
| 2006/0050446 A1* | 3/2006 | Ishizone et al. | 360/324.12 |
| 2007/0121255 A1 | 5/2007 | Tsuchiya et al. | |
| 2007/0223150 A1 | 9/2007 | Fukuzawa et al. | |
| 2007/0230070 A1* | 10/2007 | Mizuno et al. | 360/324.12 |
| 2007/0274010 A1* | 11/2007 | Hirata et al. | 360/324.11 |
| 2007/0297103 A1 | 12/2007 | Zhang et al. | |
| 2008/0019060 A1* | 1/2008 | Mizuno et al. | 360/324.12 |
| 2008/0052896 A1* | 3/2008 | Tsuchiya et al. | 360/324.12 |
| 2009/0040662 A1 | 2/2009 | Chou et al. | |
| 2010/0142101 A1* | 6/2010 | Sato et al. | 360/324.11 |

* cited by examiner

*Primary Examiner* — Craig A. Renner
(74) *Attorney, Agent, or Firm* — Hall Estill Attorneys at Law

(57) ABSTRACT

In some embodiments, a current perpendicular to the plane giant magneto-resistance (CPP GMR) read sensor may include a reference layer and/or a free layer that includes a plurality of sub-layers. For example, at least one of the reference layer or free layer may include a first ferromagnetic sub-layer, a second ferromagnetic sub-layer, and a Heusler alloy layer located between the first ferromagnetic sub-layer and the second ferromagnetic sub-layer. In some embodiments, a CPP GMR read sensor may include a current closed path (CCP) spacer layer between the reference layer and the free layer. The CCP spacer layer may include Ag and $Al_2O_3$. In further embodiments, a CPP GMR read sensor may include a Heusler alloy free layer, a Heusler alloy reference layer, and a CCP spacer layer.

19 Claims, 13 Drawing Sheets

DATA READER WITH HEUSLER ALLOY REFERENCE LAMINATION

RELATED APPLICATION

This application is a divisional of copending U.S. patent application Ser. No. 12/706,644 filed on Feb. 16, 2010.

BACKGROUND

Magnetic data storage devices include magnetic read/write heads, which detect and modify the magnetic properties of a magnetic storage medium. For example, the read/write head includes a magneto-resistive read sensor that changes resistance in response to an applied magnetic field. Based on this change in resistance, the read/write head senses or modifies the magnetic properties of the magnetic storage medium.

SUMMARY

In one aspect, the present disclosure is directed to a read sensor for a data storage device, the read sensor including a free layer, a nonmagnetic spacer layer, and a reference layer. At least one of the reference layer and the free layer includes a first ferromagnetic sub-layer, a Heusler alloy sub-layer, and a second ferromagnetic sub-layer. The Heusler alloy sub-layer is located between the first ferromagnetic sub-layer and the second ferromagnetic sub-layer, and the second ferromagnetic sub-layer is adjacent to the non-magnetic spacer layer.

The details of one or more embodiments of the invention are set forth in the accompanying drawings and the description below. Other features, objects, and advantages of the invention will be apparent from the description and drawings, and from the claims.

DETAILED DESCRIPTION

In general, the present disclosure is directed to a sensor that includes at least one layer that results in the sensor having an increased giant magneto-resistance (GMR) value. In some embodiments, the sensor may be a read sensor, such as, for example, a read sensor in a magnetic disc drive read/write head. The GMR value of the sensor may be calculated by measuring an electrical resistance of a sensor when electron spin polarization (magnetizations) of a reference layer and a free layer of the sensor are substantially parallel and measuring the electrical resistance of the sensor when the magnetizations of the reference layer and free layer are substantially anti-parallel. The change in electrical resistance between these two states then is divided by the minimum resistance of the sensor when the magnetizations of the reference layer and free layer are substantially parallel. This value is converted to a percentage, which is the GMR value.

A greater GMR value may result in an improved signal-to-noise ratio, because the resistance change for the sensor is larger between the substantially parallel magnetization and the substantially anti-parallel magnetization. Thus, techniques that increase the GMR of a read sensor may allow for a more sensitive sensor, which may facilitate use of a smaller read sensor, smaller bits on a magnetic storage medium read by the sensor, or both.

In some embodiments, a sensor including a reference layer and/or a free layer that includes a plurality of sub-layers, such as, for example, at least three or at least four sub-layers may provide an increased GMR value compared to some other sensors. A sensor that includes at least three sub-layers may include a first ferromagnetic sub-layer, a Heusler alloy sub-layer, and a second ferromagnetic sub-layer. The first and second ferromagnetic sub-layers may include, for example, CoFe or CoFeB. A sensor that includes at least four sub-layers may further include a copper layer between the Heusler alloy sub-layer and the second ferromagnetic sub-layer.

In some embodiments, a sensor including a current confined path (CCP) spacer layer in combination a Heusler alloy reference layer and a Heusler alloy free layer may provide an increased GMR value compared to some other sensors.

In some embodiments, the CCP spacer layer may include Ag and an oxide, nitride, or oxynitride of at least one of Al, Si, Hf, Mg, Ti, Ta, Mo, W, Nb, Cr, and Zr. The CCP spacer layer may include about 1 atomic percent (at. %) to about 30 at. % Ag, and in some embodiments, may include about 5 at. % to about 15 at. % Ag. A sensor including such a CCP spacer layer may also provide an increased GMR value compared to some other sensors.

Figure 1:
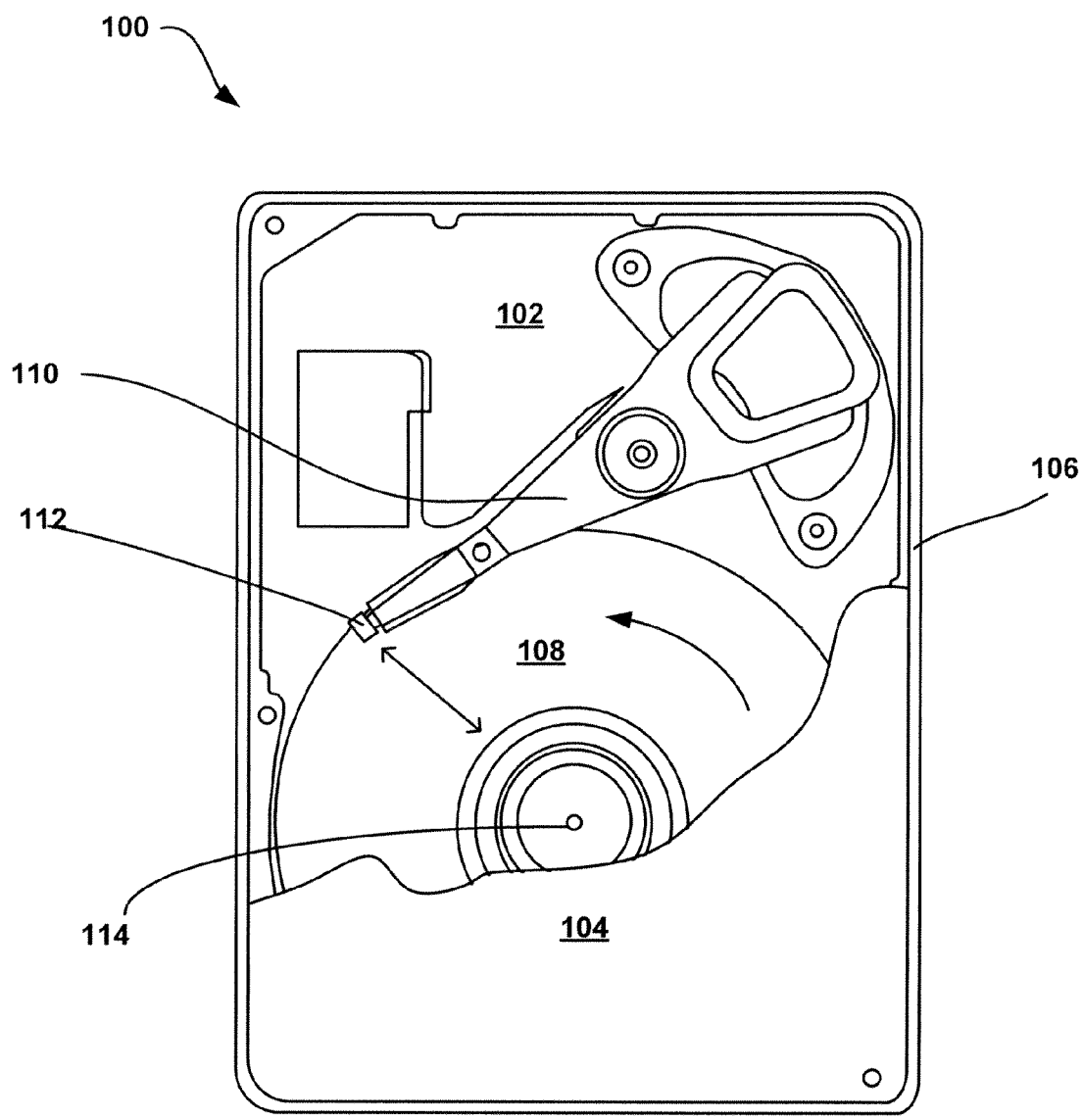
FIG. 1 is a schematic diagram of a hard disc drive.

FIG. 1 illustrates an exemplary magnetic disc drive 100 including a sensor according to one aspect of the present disclosure. Disc drive 100 includes base 102 and top cover 104, shown partially cut away. Base 102 combines with top cover 104 to form the housing 106 of disc drive 100. Disc drive 100 also includes one or more rotatable magnetic data discs 108. Data discs 108 are attached to spindle 114, which operates to rotate discs 108 about a central axis. Magnetic recording and read head 112 is adjacent to data discs 108. Actuator arm 110 carries magnetic recording and read head 112 for communication with each of the data discs 108.

Data discs 108 store information as magnetically oriented bits on a magnetic film. Magnetic read/write head 112 includes a recording (write) head that generates magnetic fields sufficient to magnetize discrete domains of the magnetic film on data discs 108. These discrete domains of the magnetic film each represent a bit of data, with one magnetic orientation representing a "0" and a substantially opposite magnetic orientation representing a "1." Magnetic recording and read head 112 also includes a read head that is capable of detecting the magnetic fields of the discrete magnetic domains of the magnetic film.

Figure 2:
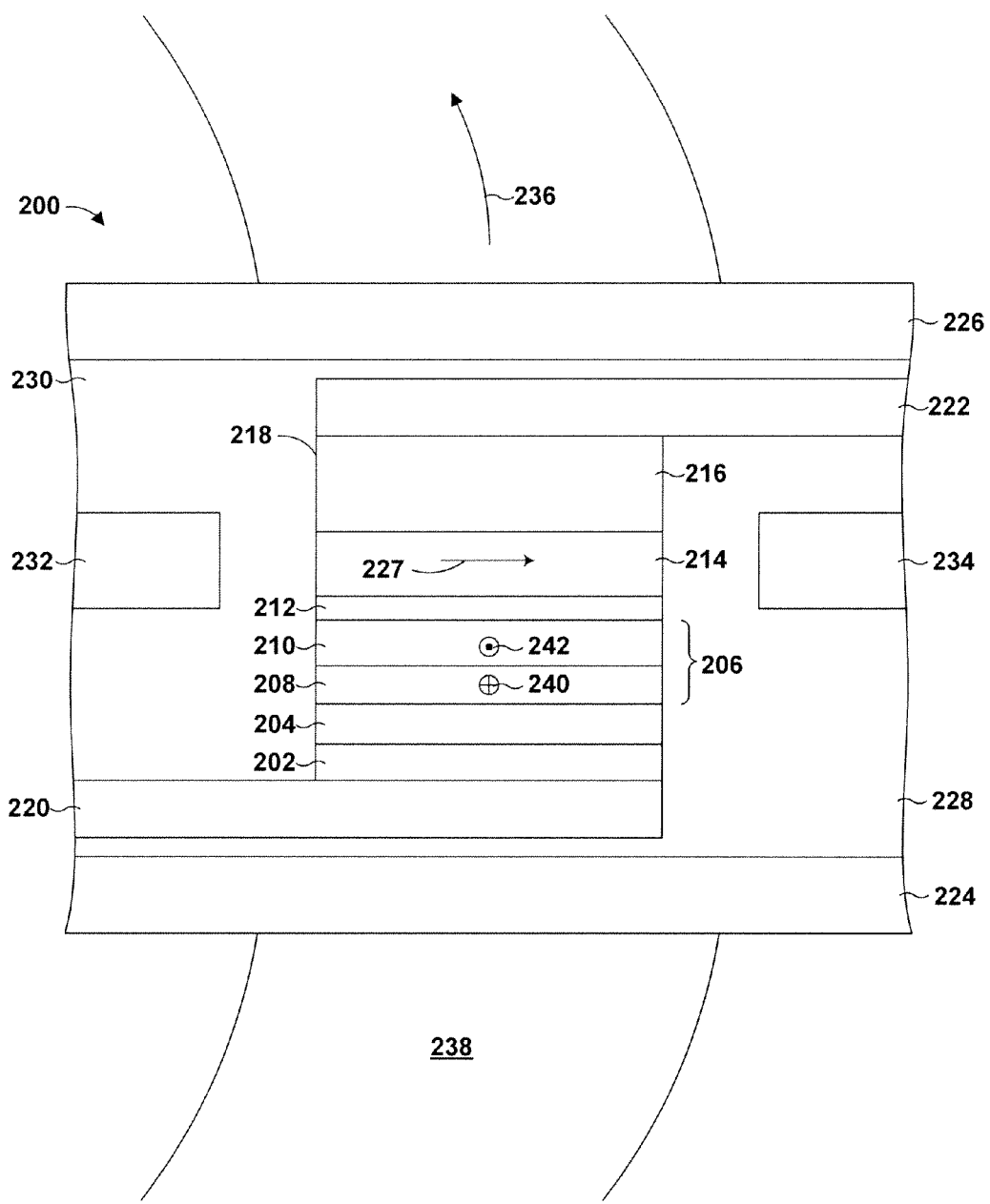
FIG. 2 is a block diagram illustrating a hard disc read head including a current perpendicular to the plane (CPP) giant magneto-resistance (GMR) sensor.

FIG. 2 is a schematic block diagram illustrating an embodiment of a hard disc read head 200 that may be used with magnetic read/write head 112 in FIG. 1. Read head 200 utilizes magneto-resistance to read data from data discs, such as data discs 108 of FIG. 1. While the precise nature of read head 200 may vary widely, a current perpendicular to the plane (CPP) giant magneto-resistance (GMR) read head will be described as one example of a read head 200 in which the disclosed materials or layers may be utilized.

Read head 200 flies over the surface of one of data discs 108 on an air bearing created by the rotation of the one of data discs 108. Each one of data discs 108 has a plurality of data tracks 238, one of which is shown in FIG. 2. Tracks 238 are divided into a plurality of bits. As disc 108 rotates, as indicated by arrow 236, read head 200 follows a data track 238 and may read each bit as it passes under sensor 218.

Read head 200 includes a first shield layer 224 and a second shield layer 226, a sensor stack 218 and two hard magnets 232 and 234. First and second shield layers 224 and 226 reduce or substantially block extraneous magnetic fields, such as, for example, those from adjacent bits on data discs 108 from influencing sensor stack 218, thus improving the performance of sensor stack 218. Ideally, first and second shield layers 224 and 226 permit magnetic fields from only the bit directly under sensor stack 218 to affect sensor stack 218, and thus be read.

Sensor stack 218 includes a plurality of layers, including a seed layer 202, an antiferromagnetic layer 204, a pinned layer 208, a reference layer 210, a nonmagnetic spacer layer 212, a free layer 214 and a cap layer 216. Seed layer 202 is electrically coupled to a first electrode 220, and cap layer 216 is electrically coupled to a second electrode 222. Seed layer 202 and cap layer 216 may each include, for example, tantalum (Ta) or ruthenium (Ru).

Antiferromagnetic layer 204 is formed on seed layer 202, and may include, for example, IrMn, PtMn, RuRnMn, NiMn, or the like. Pinned layer 208 is formed on and exchange coupled to antiferromagnetic layer 204, and may include, for example, CoFe, CoFeB, or the like. The exchange coupling fixes the magnetic moment (e.g., electron spin polarization) of pinned layer 208 in a known orientation. Likewise, the magnetic moment of pinned layer 208 induces a substantially anti-parallel magnetic field in reference layer 210. Together, pinned layer 208 and reference layer 210 form a synthetic antiferromagnet 206. The magnetic moments of each of pinned layer 208 and reference layer 210 are not allowed to rotate under magnetic fields in the range of interest (e.g., magnetic fields generated by the bits of data stored on the data discs 108). The magnetic moments of reference layer 210 and pinned layer 208 are generally oriented normal to the plane of FIG. 2 and antiparallel to each other, as indicated by arrow tail 240 and arrow head 242 (i.e., into and out of the plane of FIG. 2). In some embodiments, reference layer 210 may include, for example, CoFe, CoFeB, or the like.

Sensor stack 218 also includes a free layer 214, which is not exchange-coupled to an antiferromagnet. Thus, the magnetic moment of free layer 214 is free to rotate under the influence of an applied magnetic field in the range of interest. Free layer 214 may include one or more ferromagnetic materials, such as, for example, Co, CoFe, CoFeB, NiFe, a Heusler alloy, or the like.

Sensor stack 218 further includes nonmagnetic spacer layer 212, which separates free layer 214 and reference layer 210. Nonmagnetic spacer layer 212 may comprise, for example, a non magnetic metal, such as Ag, Cu, or the like.

Read head 200 further includes a pair of bias magnets 232 and 234, which produce a magnetic field that biases free layer 214 with a magnetic moment parallel to the plane of the figure and generally oriented horizontally, as indicated by arrow 227. This bias may prevent the magnetic moment of free layer 214 from drifting due to, for example, thermal excitations, which may introduce noise into the data sensed by read head 200. The bias is sufficiently small, however, that the magnetic moment of free layer 214 can change in response to an applied external magnetic field, such as a magnetic field of a data bit stored on data discs 108. Insulating materials 228 and 230 separate and electrically isolate sensor stack 218 and bias magnet 232 and sensor stack 218 and bias magnet 234, respectively. Insulating materials 228 and 230 may include, for example, aluminum oxide or the like.

The electrical resistance of sensor stack 218 is a function of the relative orientations of the magnetic moment of reference layer 210 and free layer 214. The lowest resistance occurs when the magnetic moments of reference layer 210 and free layer 214 are parallel, and the highest resistance occurs when the magnetic moments of reference layer 210 and free layer 214 are anti-parallel. Accordingly, the electrical resistance of sensor stack 218 changes in response to an applied magnetic field. The data bits on discs 108 may be magnetized in a direction normal to the plane of FIG. 2, either into the plane or out of the plane of FIG. 2. Thus, when sensor stack 218 passes over a data bit, the magnetic moment of free layer 214 rotates either into the plane of FIG. 2 or out of the plane of FIG. 2, changing the electrical resistance of sensor stack 218. The value of the bit being sensed by sensor stack 218 (e.g., either 1 or 0) may therefore be determined based on the current flowing from first electrode 220 through sensor stack 218 to second electrode 222.

Figure 3:
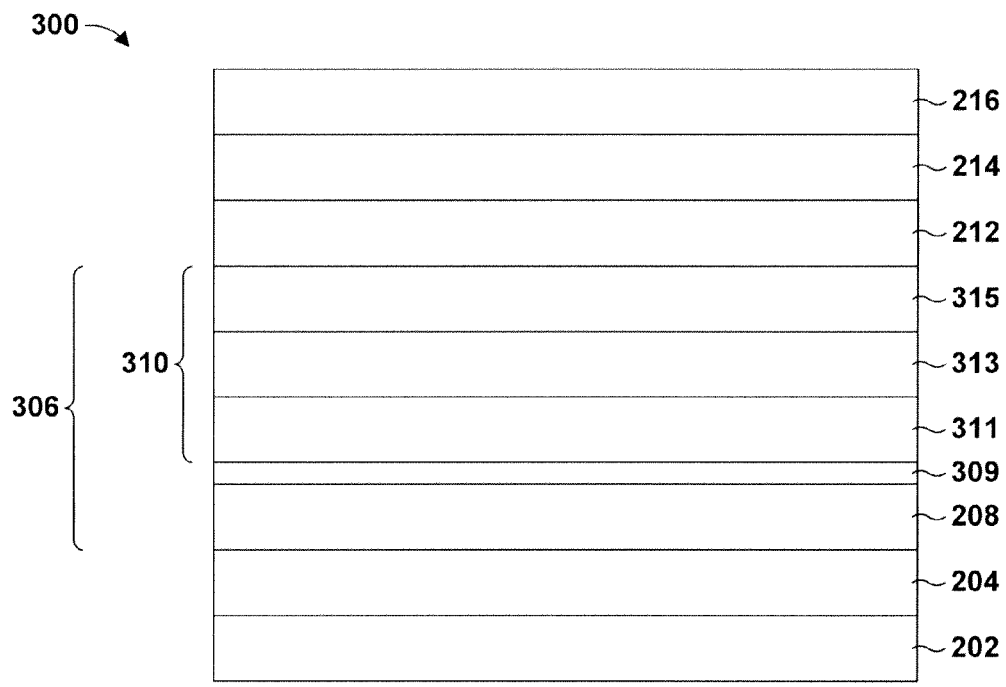
FIG. 3 is a block diagram illustrating a portion of an exemplary read sensor including a reference layer that includes a plurality of sub-layers.

FIG. 3 is a block diagram illustrating an example read sensor 300. Read sensor 300 is similar to CPP GMR sensor 218 of FIG. 2, and includes seed layer 202, antiferromagnetic layer 204 formed on seed layer 202, and pinned layer 208 formed on antiferromagnetic layer 204.

Sensor 300 further includes a synthetic antiferromagnet (AFM) spacer layer 309 formed on pinned layer 208. Synthetic AFM spacer layer 309 may include, for example, Ru.

Sensor 300 also includes a reference layer 310 formed on synthetic AFM spacer layer 309. Reference layer 310 may include a first ferromagnetic sub-layer 311, a Heusler alloy sub-layer 313 and a second ferromagnetic sub-layer 315. First ferromagnetic sub-layer 311 is formed on synthetic AFM spacer layer 309, Heusler alloy sub-layer 313 is formed on first ferromagnetic sub-layer 311, and second ferromagnetic sub-layer 315 is formed on Heusler alloy layer 313. Together, pinned layer 208, synthetic AFM spacer layer 309, and reference layer 310 constitute a synthetic AFM 306.

Use of a Heusler alloy sub-layer 313 in reference layer 310 may improve the GMR value of sensor 300. Heusler alloys have exhibited behavior that indicates nearly 100% electron spin polarization. That is, when exposed to an external magnetic field, nearly 100% of the electrons have a spin aligned with the magnetic field. Because the resistance of sensor 300 is a function of the relative spin polarizations of the electrons in free layer 214 and reference layer 310, an increased spin polarization in one or both of free layer 214 and reference layer 310 increases the change in resistance in sensor 300 between the substantially parallel and substantially anti-parallel electron spin orientations of free layer 214 and reference layer 310. Thus, a sensor 300 including a Heusler alloy sub-layer 313 in reference layer 310 may improve a GMR value of sensor 300 compared to a sensor that does not include a Heusler alloy sub-layer 313 in reference layer 310.

However, the ordered atomic structure of Heusler alloy sub-layer 313 is formed at a high temperature. This may result in inter-diffusion between Heusler alloy sub-layer 313 and nonmagnetic spacer layer 212 or between Heusler alloy sub-layer 313 and synthetic AFM spacer layer 309 when one or both of first ferromagnetic sub-layer 311 and second ferromagnetic sub-layer 315 is not present. Inter-diffusion between the layers may reduce the GMR value of sensor 300 compared to a sensor having clearly defined layer transitions.

Including first ferromagnetic sub-layer 311 and/or second ferromagnetic sub-layer 315 in addition to Heusler alloy sub-layer 313 may improve the GMR value of sensor 300. While not wishing to be bound by theory, the increased GMR value may be a result of one or more factors. First, ferromagnetic sub-layers 311 and 313 may reduce inter-diffusion between Heusler alloy sub-layer 313 and nonmagnetic spacer layer 212, and between Heusler alloy sub-layer 313 and synthetic AFM spacer layer 309, respectively. This may result in a more distinct transition from reference layer 310 to nonmagnetic spacer layer 212, which may result in the increased GMR value.

Further, second ferromagnetic sub-layer 315 may improve the grain texture of a nonmagnetic spacer layer 212 that includes a body-centered cubic (bcc) crystal lattice. In turn, the improved grain texture of nonmagnetic spacer layer 212 may improve grain texture of a free layer 214 that includes a bcc crystal lattice. It is believed that improved grain texture of free layer 214 may improve the spin polarization, and thus increase the GMR value of sensor 300.

First ferromagnetic sub-layer 311 and second ferromagnetic sub-layer 315 may include, for example, CoFe or CoFeB. In some embodiments in which at least one of first ferromagnetic sub-layer 311 and second ferromagnetic sub-layer 315 include CoFe, the CoFe may comprise up to about 70 at. % Fe. In some embodiments in which at least one of first ferromagnetic sub-layer 311 and second ferromagnetic sub-layer 315 include CoFeB, the CoFeB may comprise up to about 70 at. % Fe, about 5 at. % to about 40 at. % B, and the balance Co. First ferromagnetic sub-layer 311 may include a thickness of about 1 Å to about 15 Å, and second ferromagnetic sub-layer 315 may include a thickness of about 1 Å to about 20 Å.

In some embodiments, a second ferromagnetic sub-layer 315 that includes CoFeB may be preferred, because CoFeB may promote improved grain structure of nonmagnetic spacer layer 212.

Heusler alloy sub-layer 313 may include, for example, an alloy having a chemical formula of $A_2BC$, where A includes an element selected from the group consisting of Co, Ir, Rh, Pt, Cu, and combinations there, B includes an element selected from the group consisting of V, Cr, Mn, Fe, and combinations thereof, and C includes an element selected from the group consisting of Al, Si Ga, Sn, Ge, and combinations thereof. The alloy may include about 15 at. % to about 40 at. % B, about 15 at. % to about 40 at. % C, and the balance A. Heusler alloy sub-layer 303 may be formed to a thickness ranging from about 5 Å to about 100 Å.

In some embodiments, Heusler alloy sub-layer 313 may include an alloy having the formula $Co_2MnX$, where X comprises an element selected from the group consisting of Ge, Si, Al, Ga, and Sn. The alloy may comprise about 15 at. % to about 40 at. % Mn, about 15 at. % to about 40 at. % X, and the balance Co. One preferred embodiment includes $Co_2MnGe$ comprising about 15 at. % to about 40 at. % Mn, about 15 at. % to about 40 at. % Ge, and the balance Co.

Figure 4:
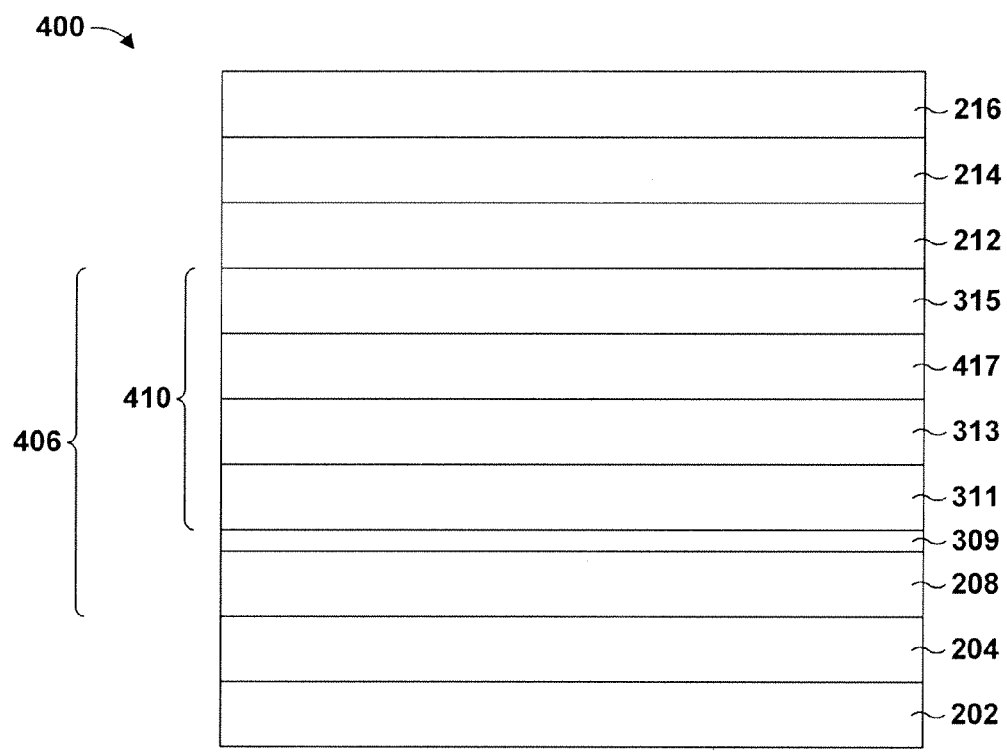
FIG. 4 is a block diagram illustrating a portion of another exemplary read sensor including a reference layer that includes a plurality of sub-layers.

FIG. 4 is a block diagram of another exemplary read sensor 400. Read sensor 400 includes a reference layer 410 including first ferromagnetic sub-layer 311, Heusler alloy sub-layer 313, and second ferromagnetic sub-layer 315. In addition, reference layer 410 includes a nonmagnetic metal sub-layer 417, which is located between Heusler alloy sub-layer 313 and second ferromagnetic sub-layer 315.

Nonmagnetic metal sub-layer 417 may be a thin layer of a nonmagnetic material, such as, for example, Ag, Cu, or the like. Nonmagnetic metal sub-layer 417 may be thin, so that strong magnetic coupling occurs between Heusler alloy sub-layer 313 and second ferromagnetic sub-layer 315. For example, nonmagnetic metal sub-layer 417 may have a thickness of about 1 Å to about 15 Å. Similar to synthetic AFM 306 described with respect to FIG. 3, reference layer 410, synthetic AFM spacer layer 309, and pinned layer 208 constitute an AFM 406.

Figure 5:
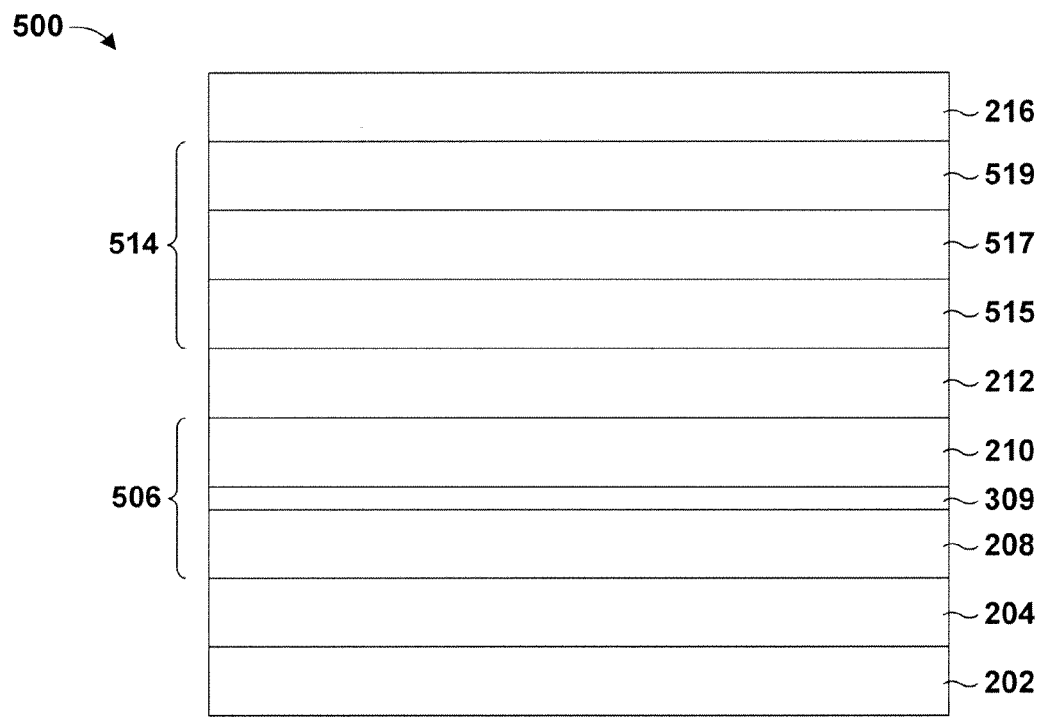
FIG. 5 is a block diagram illustrating a portion of an exemplary read sensor including a free layer that includes a plurality of sub-layers.

In other embodiments, as illustrated in the block diagram of FIG. 5, a read sensor 500 may include a reference layer 210 including a single layer formed of a ferromagnetic material. In the embodiment illustrated in FIG. 5, reference layer 210, synthetic AFM spacer layer 309 and pinned layer 208 constitute a synthetic AFM 506.

Read sensor 500 further includes a free layer 514 including a first ferromagnetic sub-layer 519, and Heusler alloy sub-layer 517, and a second ferromagnetic sub-layer 515. As FIG. 5 illustrates, second ferromagnetic sub-layer 515 is adjacent nonmagnetic spacer layer 212, and Heusler alloy sub-layer 517 is located between first ferromagnetic sub-layer 519 and second ferromagnetic sub-layer 515.

Forming sensor 500 to include a free layer 514 that comprises a Heusler alloy sub-layer 517 located between first ferromagnetic sub-layer 519 and second ferromagnetic sub-layer 515 may improve the GMR value of sensor 500 compared to a sensor including a free layer 514 having only a single layer. Similar to the discussion of reference layer 310 above, including second ferromagnetic sub-layer 515 may reduce inter-diffusion between Heusler alloy layer 517 and nonmagnetic spacer layer 212 during heat treatment of the Heusler alloy layer 517 to order to atomic or crystal structure thereof. This may maintain a relatively distinct interface between nonmagnetic spacer layer 212 and free layer 514, which may improve the GMR value of sensor 500.

First ferromagnetic sub-layer 519 and second ferromagnetic sub-layer 515 may include, for example, CoFe or CoFeB. In some embodiments in which at least one of first ferromagnetic sub-layer 519 and second ferromagnetic sub-layer 515 include CoFe, the CoFe may comprise up to about 70 at. % Fe. In some embodiments in which at least one of first ferromagnetic sub-layer 519 and second ferromagnetic sub-layer 515 include CoFeB, the CoFeB may comprise up to about 70 at. % Fe, about 5 at. % to about 40 at. % B, and the balance Co. First ferromagnetic sub-layer 519 may include a thickness of about 1 Å to about 20 Å, and second ferromagnetic sub-layer 515 may include a thickness of about 1 Å to about 20 Å.

Heusler alloy sub-layer 517 may include, for example, an alloy having a chemical formula of $A_2BC$, where A includes an element selected from the group consisting of Co, Ir, Rh, Pt, Cu, and combinations there, B comprises an element selected from the group consisting of V, Cr, Mn, Fe, and combinations thereof, and C comprises an element selected from the group consisting of Al, Si Ga, Sn, Ge, and combinations thereof. The alloy may include about 15 at. % to about 40 at. % B, about 15 at. % to about 40 at. % C, and the balance A.

In some embodiments, Heusler alloy sub-layer 517 may include an alloy having the formula $Co_2MnX$, where X comprises an element selected from the group consisting of Ge, Si, Al, Ga, and Sn. The alloy may comprise about 15 at. % to about 40 at. % Mn, about 15 at. % to about 40 at. % X, and the balance Co. One preferred embodiment includes $Co_2MnGe$ comprising about 15 at. % to about 40 at. % Mn, about 15 at. % to about 40 at. % Ge, and the balance Co.

Figure 6:
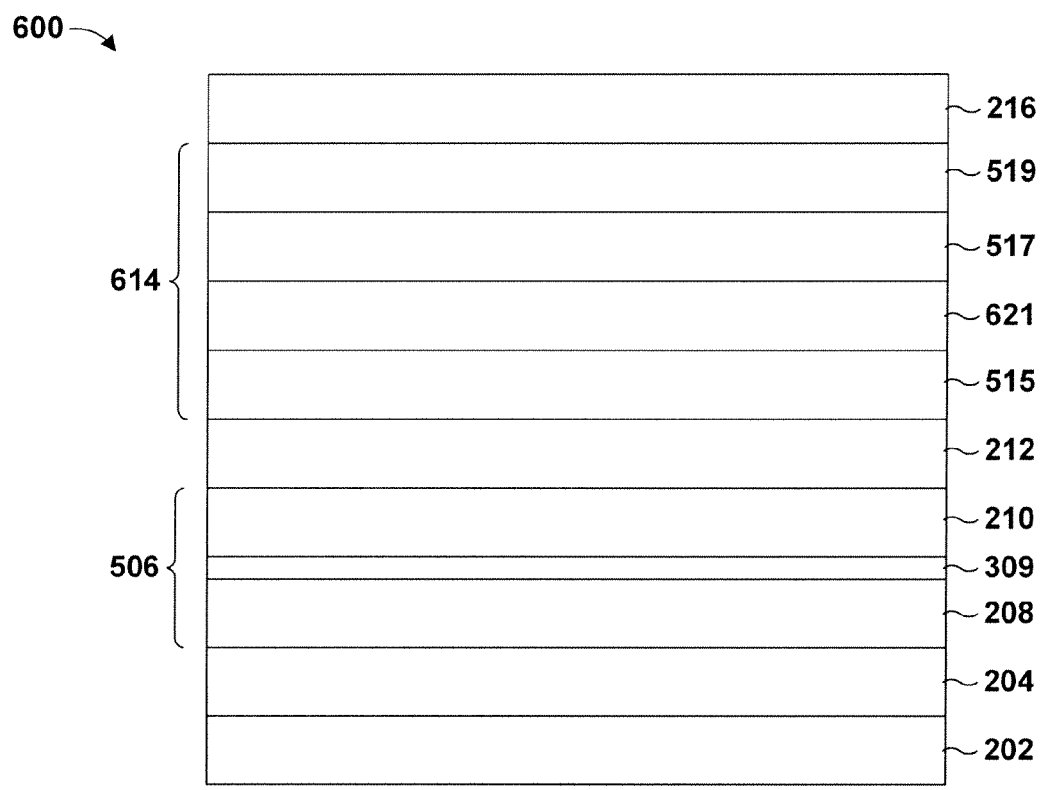
FIG. 6 is a block diagram illustrating a portion of another exemplary hard disc read sensor including a free layer that includes a plurality of sub-layers.

FIG. 6 is a block diagram of another exemplary read sensor 600. Read sensor 600 includes a free layer comprising first ferromagnetic sub-layer 519, Heusler alloy sub-layer 517, second ferromagnetic sub-layer 515, and a nonmagnetic metal sub-layer 621. Second ferromagnetic sub-layer 515 is again adjacent nonmagnetic spacer layer 212, and nonmagnetic metal sub-layer 621 is located between Heusler alloy sub-layer 517 and second ferromagnetic sub-layer 515.

Nonmagnetic metal sub-layer 621 may be a thin layer of a nonmagnetic material, such as, for example, Cu. Nonmagnetic metal sub-layer 621 may be thin, so that strong magnetic coupling occurs between Heusler alloy sub-layer 517 and second ferromagnetic sub-layer 515. For example, nonmagnetic metal sub-layer 621 may have a thickness of about 1 Å to about 15 Å.

Figure 7:
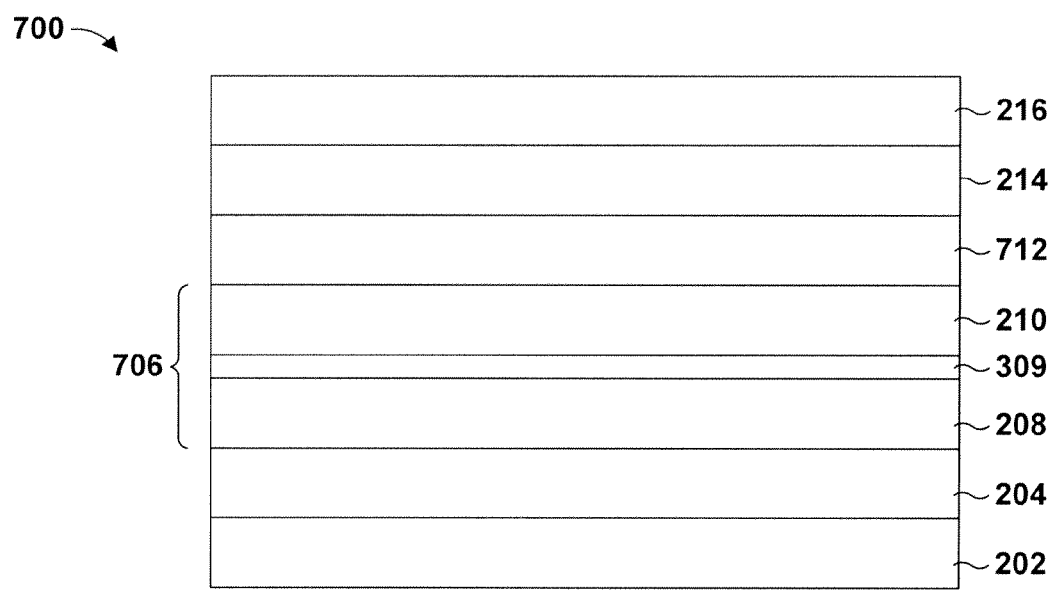
FIG. 7 is a block diagram illustrating a portion of an exemplary hard disc read sensor including a Heusler alloy free layer, a Heusler alloy reference layer, and a current confined path (CCP) spacer layer between the Heusler alloy free layer and the Heusler alloy reference layer.

FIG. 7 is a block diagram of an exemplary read sensor 700 including a current closed path (CCP) spacer layer 712 between reference layer 210 and free layer 214. Similar to sensor 300 of FIG. 3, read sensor 700 includes seed layer 202, AFM layer 204 formed on seed layer 202, pinned layer 208 formed on AFM layer 204, and synthetic AFM layer 309 formed on pinned layer 208. Together, pinned layer 208, synthetic AFM spacer 309 and reference layer 210 form a synthetic AFM 706. Read sensor 700 further includes cap layer 216 formed on free layer 214.

Figure 8A:
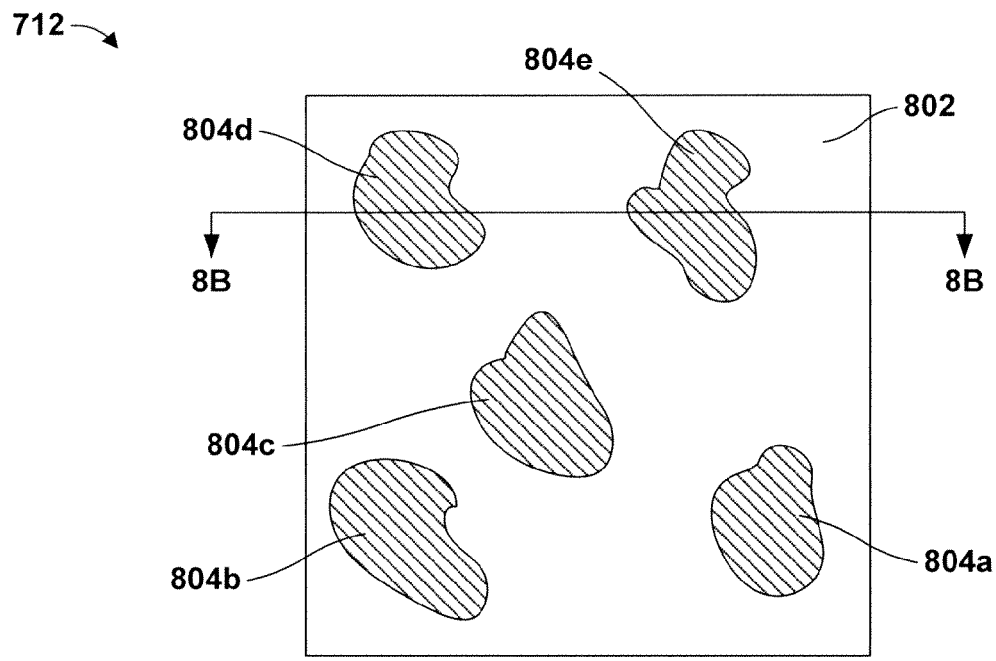
FIG. 8A is a top view of a CCP spacer layer.
Figure 8B:
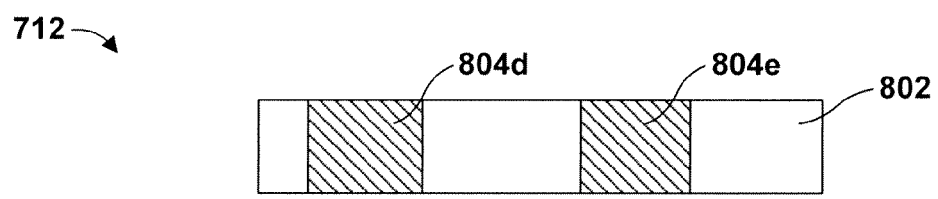
FIG. 8B is a cross-section view of the CCP spacer layer of FIG. 8A.

CCP spacer layer 712 may increase the GMR value of read sensor 700. As illustrated in FIGS. 8A and 8B, CCP spacer layer 712 may include a plurality of electrically conductive channels 804a, 804b, 804c, 804d, and 804e (collectively "conductive channels 804") formed in an electrically insulative matrix 802. By providing a reduced cross-section through which current may be conducted, the resistance of CCP spacer layer 712 may be greater than the resistance of a spacer layer that is formed of substantially only conductive material. In addition, a reduced cross-section may also increase the contribution of interface resistance between CCP spacer layer 712 and reference layer 210 and CCP spacer layer 712 and free layer 214, respectively, to the overall resistance of the read sensor 700. The increased resistance of CCP spacer layer 712 compared to a spacer layer formed of only conductive material may result in an increased resistance of read sensor 700 compared to a read sensor that does not include a CCP spacer layer 712, which may result in an increased signal amplitude from read sensor 700.

The elements that form conductive channels 804 and electrically insulative matrix 802 may be co-deposited in a layer on reference layer 210. The elements may possess different bonding energies with oxygen, nitrogen or both, such that selective oxidation of the element that forms electrically insulative matrix 802 occurs, and substantially no oxidation of the element that forms conductive channels 804 occurs. Thus, oxidation of the element that forms electrically insulative matrix 802 may be performed after deposition of CCP spacer layer 712.

Another consideration that influences selection of the elements which form CCP spacer layer 712 is the effect the material that forms conductive channels 804 has on the spin polarization of electrons in the current flowing through conductive channels 804. The spin diffusion length is a measure of this effect, and may be sufficiently long in conductive channels 804 so that substantially no electrons having a spin polarization depolarize while traversing conductive channels 804.

Conductive channels 804 may be formed of an electrically conductive material. In some embodiments, the electrically conductive material may have a spin diffusion length sufficiently long that substantially no electrons having a spin polarization depolarize while traversing conductive channels 804. For example, conductive channels 804 may include at least one of Ag, Cu, Au, Co, Fe, Ni, Ta, and W.

Electrically insulative matrix 802 may include an electrically insulative material. For example, electrically insulative matrix 802 may include at least one of an oxide, nitride, or oxynitride of an element selected from the group consisting of Al, Si, Hf, Mg, Ti, Ta, Mo, W, Nb, Cr, or Zr.

CCP spacer layer 712 may include about 1 at. % to about 30 at. % conductive channel material, or about 5 at. % to about 15 at. % conductive channel material, and the balance electrically insulative material.

In some embodiments, CCP spacer layer 712 may comprise Ag and $Al_2O_3$. Some preferred embodiments include about 1 at. % to about 30 at. % Ag and the balance $Al_2O_3$, while other embodiments include about 5 at. % to about 15 at. % Ag and the balance $Al_2O_3$.

CCP spacer layer 712 may be formed to a thickness of about 1 Å to about 40 Å.

The elements that form conductive channels 804 and electrically insulative matrix 802 may be co-deposited in a substantially homogeneous layer on reference layer 210, which is then subjected to a heat treatment. The layer may be exposed to a heat treatment of about 150° C. to about 400° C. for about 0.1 minutes to about 50 minutes, which may result in the segregation of the elements that form conductive channels 804 and electrically insulative matrix 802 into substantially distinct domains. The elements may possess different bonding energies with oxygen, nitrogen or both, such that selective oxidation of the element that forms electrically insulative matrix 802 occurs, and substantially no oxidation of the element that forms conductive channels 804 occurs. Thus, oxidation of the element that forms electrically insulative matrix 802 may be performed after deposition of CCP spacer layer 712. In some examples, CCP spacer layer 712 may undergo a sputter-etching or ion-milling process after oxidation. The sputter-etching or ion-milling process may preferentially etch conductive channels 804.

Figure 9:
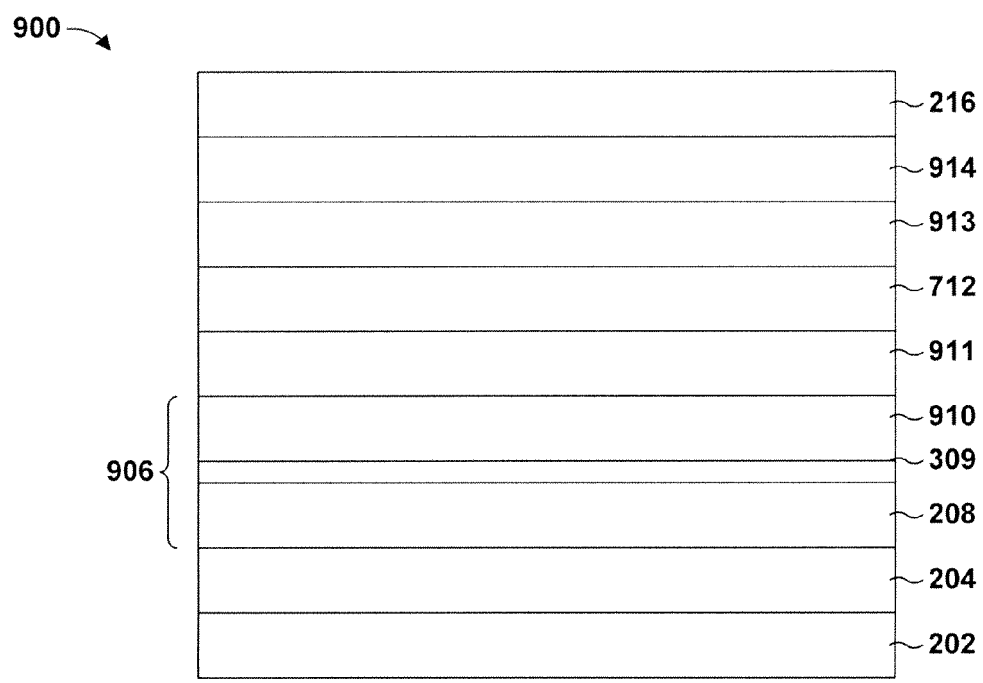
FIG. 9 is a block diagram illustrating a portion of an exemplary hard disc read sensor including a reference layer, a free layer, a CCP spacer layer, and nonmagnetic interlayers between the CCP spacer layer and the free layer and the CCP spacer layer and the reference layer.

FIG. 9 is a block diagram of another exemplary read sensor 900, which may have a synthetic AFM 906 that has a Heusler alloy reference layer 910 opposite the synthetic AFM layer 309 from the pinned layer 208. As shown, the read sensor 900 may further have a Heusler alloy free layer 914, CCP spacer layer 712, a first intermediate layer 911 between CCP spacer layer 712 and Heusler alloy reference layer 910, and a second intermediate layer 913 between CCP spacer layer 712 and Heusler alloy free layer 914.

As described above, a Heusler alloy may possess nearly 100% spin polarization. This may increase the GMR value of read sensor 900. Further, as described above with reference to FIG. 7, CCP spacer layer 712 may increase the GMR value of a sensor. Thus, a sensor that includes Heusler alloy reference layer 910, Heusler alloy free layer 914 and CCP spacer layer 712 may further increase the GMR value of read sensor 900 compared to a read sensor that does not include one or more of these layers.

Heusler alloy reference layer 910 and Heusler alloy free layer 914 may include, for example, alloys having a chemical formula of $A_2BC$, where A includes an element selected from the group consisting of Co, Ir, Rh, Pt, Cu, and combinations there, B comprises an element selected from the group consisting of V, Cr, Mn, Fe, and combinations thereof, and C comprises an element selected from the group consisting of Al, Si Ga, Sn, Ge, and combinations thereof. The alloy may include about 15 at. % to about 40 at. % B, about 15 at. % to about 40 at. % C, and the balance A.

In some embodiments, at least one of Heusler alloy reference layer 910 and Heusler alloy free layer 914 may include an alloy having the formula $Co_2MnX$, where X comprises an element selected from the group consisting of Ge, Si, Al, Ga, and Sn. The alloy may comprise about 15 at. % to about 40 at. % Mn, about 15 at. % to about 40 at. % X, and the balance Co. One preferred embodiment includes $Co_2MnGe$ comprising about 15 at. % to about 40 at. % Mn, about 15 at. % to about 40 at. % Ge, and the balance Co.

As described above, CCP spacer layer 712 includes electrically insulative matrix 802 and conductive channels 804. Conductive channels 804 may be formed of an electrically conductive material. In some embodiments, the electrically conductive material may have a spin diffusion length sufficiently long that substantially no electrons having a spin polarization depolarize while traversing conductive channels 804. For example, conductive channels 804 may include at least one of Ag, Cu, Au, Co, Fe, Ni, Ta, and W.

Electrically insulative matrix 802 may include an electrically insulative material. For example, electrically insulative matrix 802 may include at least one of an oxide, nitride, or oxynitride of an element selected from the group consisting of Al, Si, Hf, Mg, Ti, Ta, Mo, W, Nb, Cr, or Zr.

CCP spacer layer 712 may include about 1 at. % to about 15 at. % conductive channel material, and the balance electrically insulative material.

In some embodiments, CCP spacer layer 712 may comprise Ag and $Al_2O_3$. Some preferred embodiments include about 1 at. % to about 15 at. % Ag and the balance $Al_2O_3$.

Read sensor 900 further includes first interlayer 911 between Heusler alloy reference layer 910 and CCP spacer layer 712 and second interlayer 913 between CCP spacer layer 712 and Heusler alloy free layer 914. First and second interlayers 911 and 913 may improve electrical contact between conductive channels 804 and Heusler alloy free layer 914 and Heusler alloy reference layer 910, respectively.

First interlayer 911 may also protect Heusler alloy reference layer 910 from damage during oxidation of CCP spacer layer 712. Damage of Heusler alloy reference layer 910 may undesirably increase resistance of read sensor 900.

First interlayer 911 and second interlayer 913 may also affect the magnetic coupling between Heusler alloy reference layer 910 and Heusler alloy free layer 914. For example, thicker interlayers 911 and 913 may reduce magnetic coupling of Heusler alloy reference layer and Heusler alloy free layer 914. This may reduce the GMR value of read sensor 900. Thus, relatively thin, e.g., about 1 Å to about 20 Å, first and second interlayers 911 and 913 may be desired to maintain a desired GMR value of read sensor.

First and second interlayers 911 and 913 may comprise a magnetic or nonmagnetic material. In some embodiments, first interlayer 911 may comprise a magnetic material and second interlayer 913 may comprise a nonmagnetic material, or vice versa. In embodiments in which at least one of first interlayer 911 and second interlayer 913 comprises a nonmagnetic material, the at least one of first interlayer 911 and second interlayer 913 may comprise Al, Ti, Cu, Mg, Ag, Au, or combinations thereof. In embodiments in which at least one of first interlayer 911 and second interlayer 913 comprises a magnetic material, the at least one of first interlayer 911 and second interlayer 913 may comprise Co, Fe, Ni, or combinations thereof.

While CCP spacer layer 712 has been described as being used in a read sensor independently of a reference layer or free layer that includes a plurality of sub-layers, some embodiments may include both a CCP spacer layer 712 and a reference layer (e.g., reference layer 310 or reference layer 410) that includes a plurality of sub-layers. Other embodiments may include both a CCP spacer layer 712 and a free layer (e.g., free layer 514 or free layer 614) that includes a plurality of sub-layers. Still other embodiments may include a CCP spacer layer 712, a reference layer (e.g., reference layer 310 or reference layer 410) that includes a plurality of sub-layers, and a free layer (e.g., free layer 514 or free layer 614) that includes a plurality of sub-layers. Including two or more of CCP spacer layer 712, a reference layer including a plurality of sub-layers, and a free layer that includes a plurality of sub-layers may further increase the GMR value of a read sensor.

EXAMPLES

Examples 1-5

FIG. 10-14 are scatter plots of GMR versus the product of resistance times area (RA) for CPP GMR read sensors. The CPP GMR read sensors are substantially similar, differing only in the construction of the reference layer. In fact, each reference layer includes a CoFe bottom layer, and a Heusler alloy layer formed on the CoFe bottom layer. However, the layers formed on the Heusler alloy layer, if any, differ among the samples illustrated in FIGS. 10-14.

Figure 10:
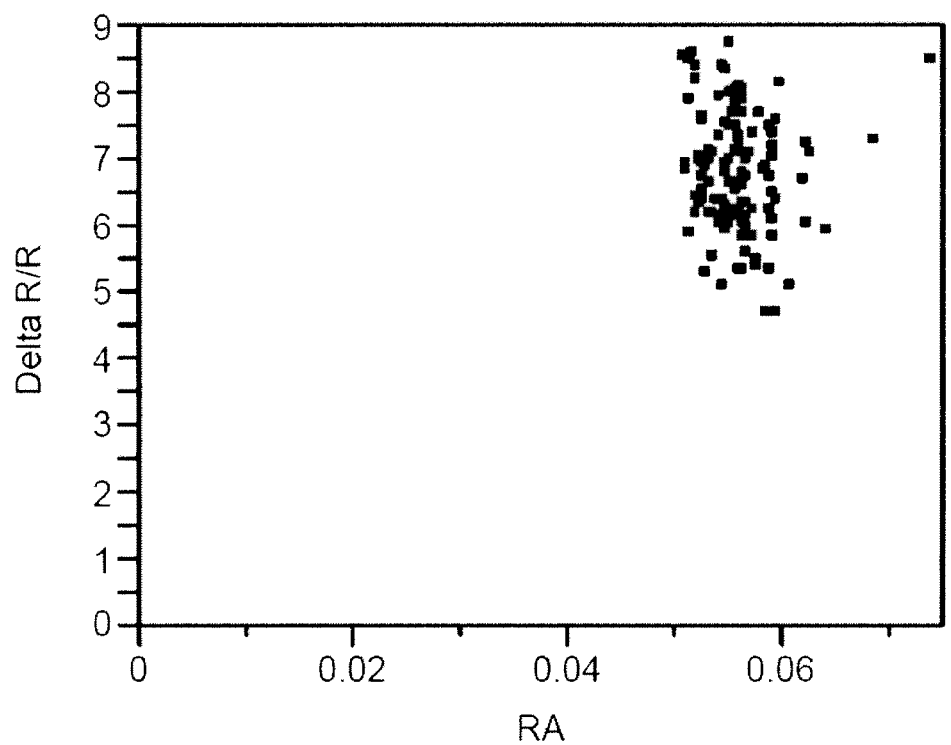
FIG. 10 is a scatter plot of GMR versus product of resistance times area (RA) for a set of CPP GMR read sensors including a CoFe/Heusler alloy bi-layer reference layer.

In FIG. 10, the reference layer includes a CoFe/Heusler alloy bi-layer, with no layer formed on the Heusler alloy layer.

The average GMR value of the samples in FIG. 10 is about 6.75%. The average RA of the CPP GMR read sensors is about 0.055 $\Omega\mu m^2$.

Figure 11:
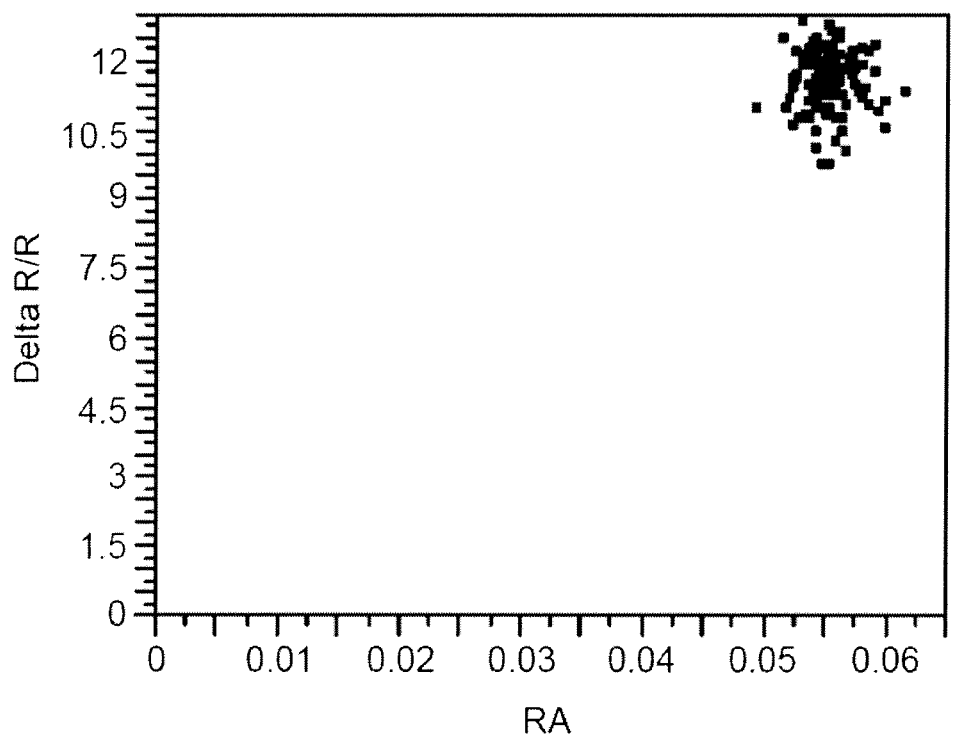
FIG. 11 is a scatter plot of GMR versus RA for a set of CPP GMR read sensors including a CoFe/Heusler alloy/CoFe tri-layer reference layer.

FIG. 11 illustrates the results of a set of CPP GMR read sensors including a CoFe/Heusler alloy/CoFe tri-layer reference layer. The average GMR value of the samples in FIG. 11 is about 11.5%, and the average RA of the samples is about 0.055 $\Omega\mu m^2$.

Figure 12:
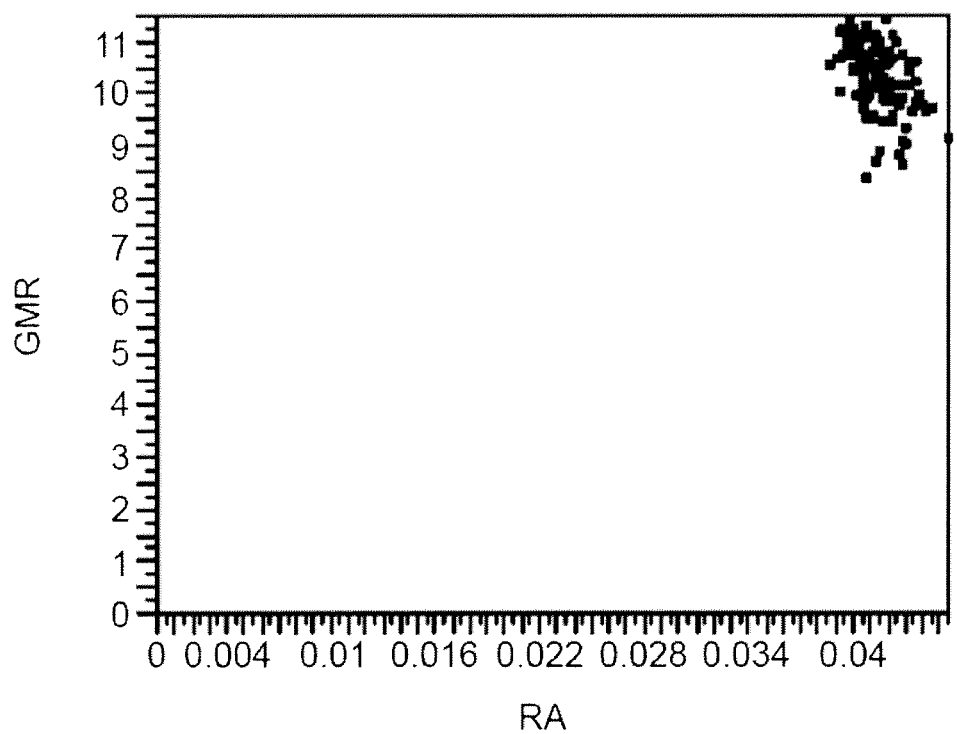
FIG. 12 is a scatter plot of GMR versus RA for a set of CPP GMR read sensors including a CoFe/Heusler alloy/CoFeB tri-layer reference layer.

FIG. 12 illustrates the results of a set of CPP GMR read sensors including a CoFe/Heusler alloy/CoFeB tri-layer reference layer. The average GMR value of the samples in FIG. 12 is about 10.3%, and the average RA of the samples is about 0.04 $\Omega\mu m^2$.

Figure 13:
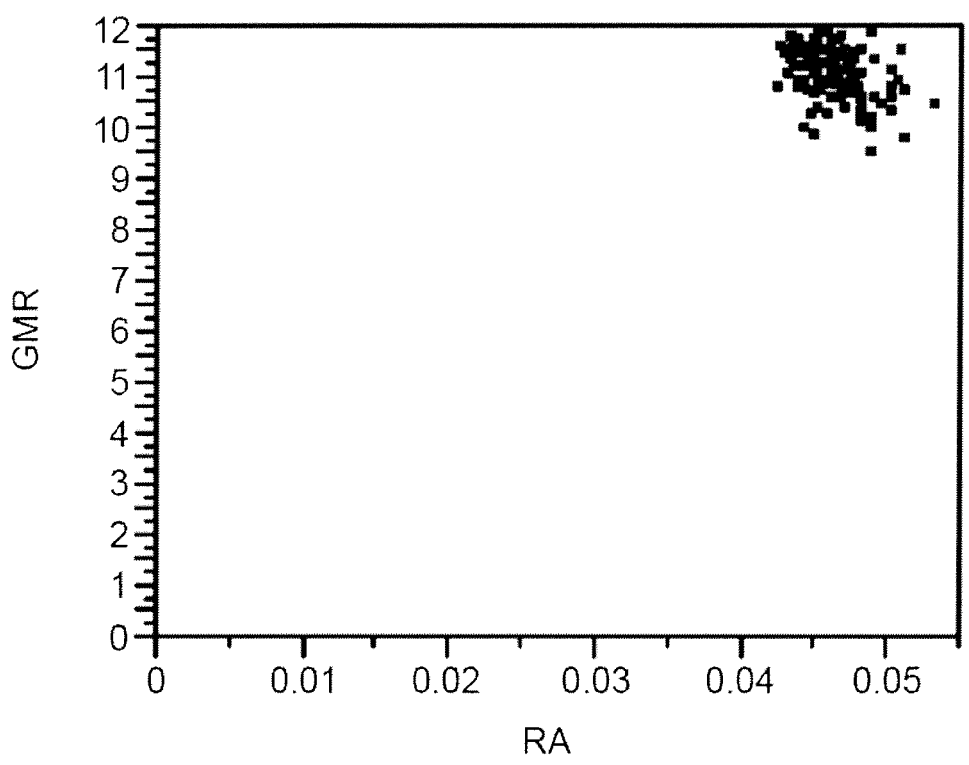
FIG. 13 is a scatter plot of GMR versus RA for a set of CPP GMR read sensors including a CoFe/Heusler alloy/thin Cu/CoFe tetra-layer reference layer.

FIG. 13 illustrates the results of a set of CPP GMR read sensors including a CoFe/Heusler alloy/thin Cu/CoFe tetra-layer reference layer. The average GMR value of the samples in FIG. 13 is about 11%, and the average RA of the samples is about 0.044 $\Omega\mu m^2$. The Cu layer purposely was formed as a thin layer to maintain strong magnetic coupling between the Heusler alloy layer and the CoFe layer formed on the thin Cu layer. In this way, the Heusler alloy layer and CoFe layer act together as the reference layer.

Figure 14:
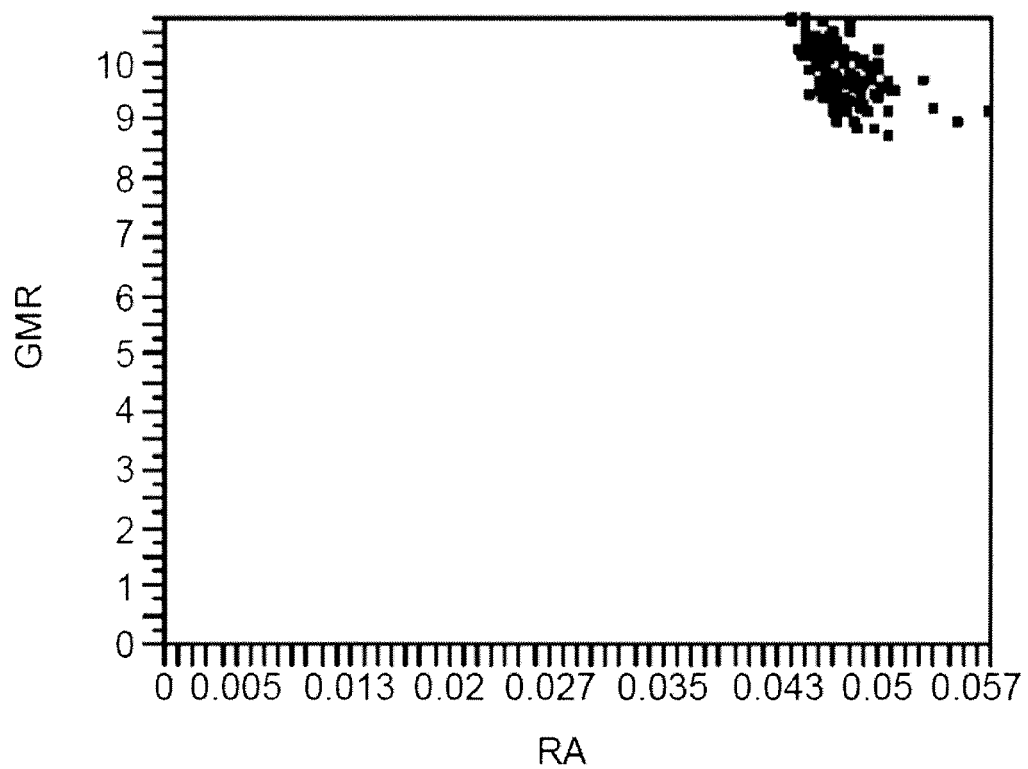
FIG. 14 is a scatter plot of GMR versus RA for a set of CPP GMR read sensors including a CoFe/Heusler alloy/thin Cu/CoFeB tetra-layer reference layer.

FIG. 14 illustrates the results of a set of CPP GMR read sensors including a CoFe/Heusler alloy/thin Cu/CoFeB tetra-layer reference layer. The average GMR value of the samples in FIG. 12 is about 9.7%, and the average RA of the samples is about 0.048 $\Omega\mu m^2$. Again, the Cu layer purposely was formed as a thin layer to maintain strong magnetic coupling between the Heusler alloy layer and the CoFeB layer formed on the thin Cu layer. In this way, the Heusler alloy layer and CoFeB layer act together as the reference layer.

As seen in a comparison of the results of the samples in FIGS. 10 and 11, a reference layer including a CoFe formed on the Heusler alloy layer results in an increase of the GMR value from about 6.75% to about 11.5%, at a similar RA to the samples of FIG. 10. Similarly, comparing the results of the samples in FIGS. 10 and 12 reveals that a reference layer including a CoFeB layer formed on the Heusler alloy layer results in an increase of the GMR value from about 6.75% to about 10.3%, while the RA decreases from about 0.055 $\Omega\mu m^2$ to about 0.04 $\Omega\mu m^2$. While not wishing to be bound by any theory, one possible explanation is that both the CoFe layer formed on the Heusler alloy layer and the CoFeB layer formed on the Heusler alloy layer may reduce interlayer diffusion between the Heusler alloy layer and the spacer layer. This may improve the distinctness of the transition between the reference layer and spacer layer.

In addition, the formation of a CoFeB layer on the Heusler alloy layer may improve the crystal texture of a spacer layer with a body centered cubic (bcc) crystalline structure. The improved crystal texture of the spacer layer may then improve the crystalline texture of a bcc free layer formed on the spacer layer. The improved crystal texture of the free layer may increase the spin polarization between the reference layer and free layer, which may increase the GMR value of the CPP GMR read sensor.

Examples 6 and 7

Figure 15:
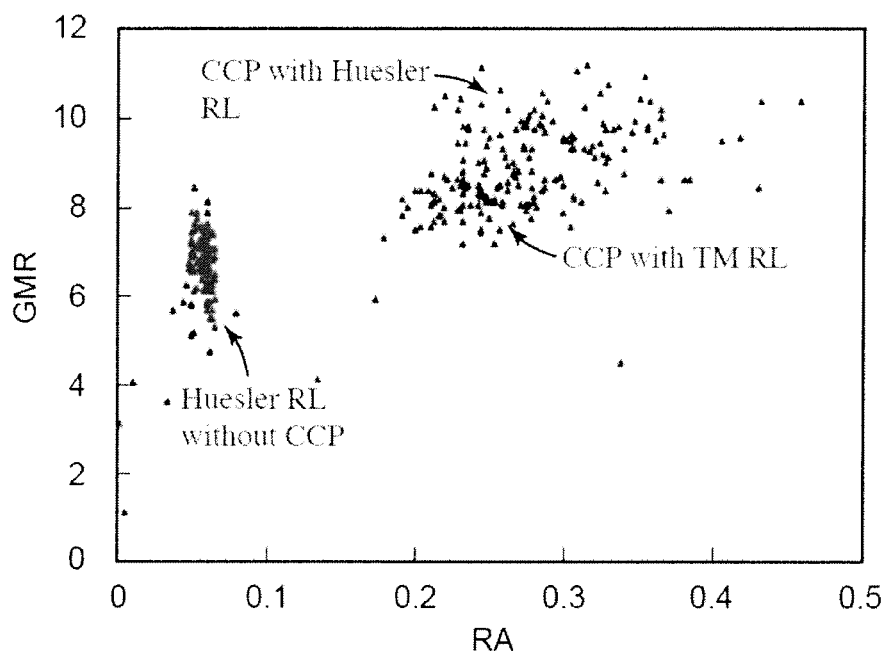
FIG. 15 is a scatter plot of GMR versus RA for three sets of CPP GMR read sensors including a current confined path (CCP) spacer layer.

FIG. 15 is a scatter plot that compares the GMR values of different CPP GMR read sensors. A first set of CPP GMR read sensors, included a Heusler reference layer and a Cu spacer layer. A second set of CPP GMR read sensors, included a transition metal reference layer and a CCP spacer layer. A third set of CPP GMR read sensors, included a Heusler reference layer and a CCP spacer layer. All other layers were identical. The first set of CPP GMR read sensors had a GMR value between about 6% and 8%. The GMR value was enhanced to over 8% in the second set of CPP GMR read sensors. The third set of CPP GMR read sensors, having both a Heusler alloy reference layer and a CCP spacer layer, had a GMR value of about 10%. Higher GMR can be expected with a CCP spacer layer and a Heusler alloy reference layer and a Heusler alloy free layer.

Figure 16A:
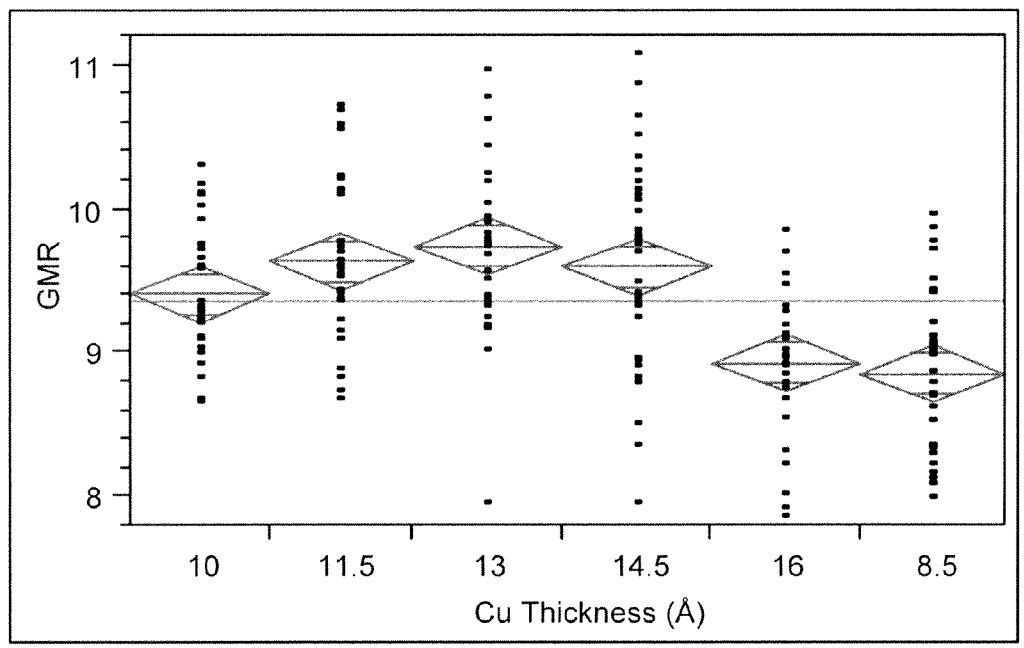
FIGS. 16A and 16B are scatter plots of GMR versus Cu interlayer thickness and RA versus Cu interlayer thickness, respectively.
Figure 16B:
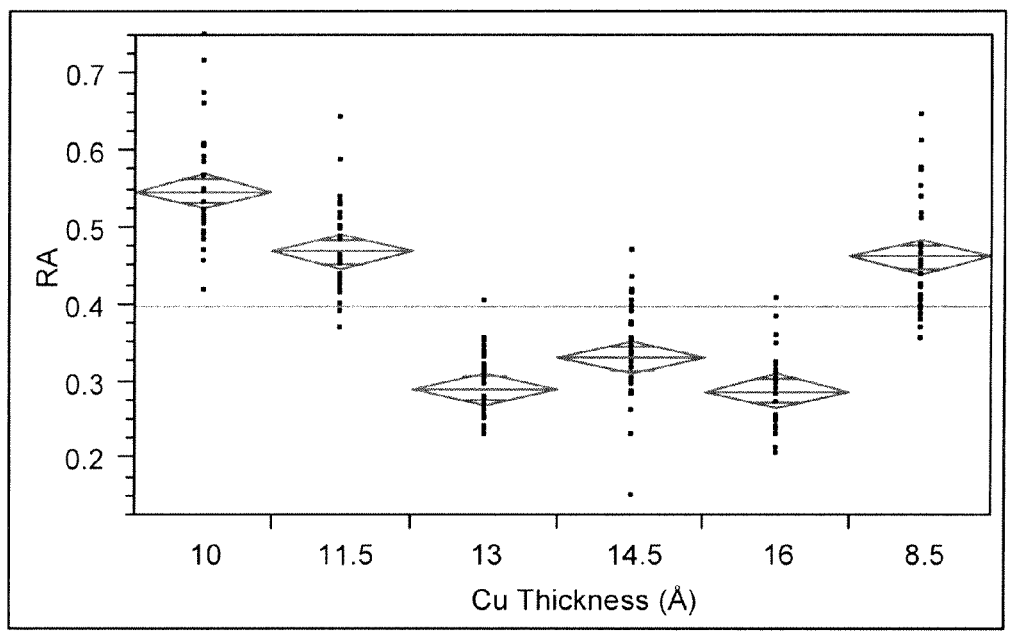

FIGS. 16A and 16B are plots of GMR versus Cu interlayer thickness and RA versus Cu interlayer thickness, respectively. The Cu interlayer was located between a Heusler alloy reference layer and a CCP spacer layer. Each sample had the same stack structure, including a CCP spacer layer including approximately 10 at. % Ag and approximately 90 at. % Al, a Heusler-alloy reference layer, and a free layer including a CoFe/Cu/CoFe/Cu/CoFe multilayer structure. More particularly, the free layer included a 10 Å layer including approximately 50 at. % Co and 50 at. % Fe, a 3 Å layer of Cu, a 10 Å layer including approximately 50 at. % Co and 50 at. % Fe, a 3 Å layer of Cu, and a 10 Å layer including approximately 50 at. % Co and 50 at. % Fe. As FIGS. 16A and 16B illustrate, a thinner Cu layer generally resulted in a higher RA, indicating that Heusler alloy reference layer may have been damaged by the oxidation process used to form the CCP spacer layer. However, if the Cu interlayer was too thick, the effect of the CCP spacer layer was too weak and resulted in a lower GMR value. This result confirmed that both CCP and Heusler alloy contribute to GMR effect.

Examples 8-10

Figure 17:
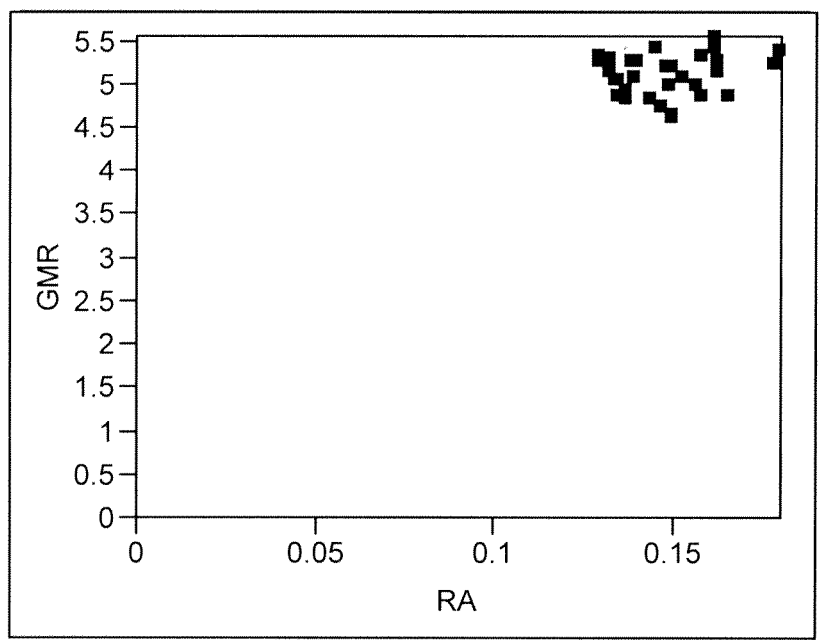
FIG. 17 is a scatter plot of GMR versus RA for a sample including a CCP spacer layer, a CoFe reference layer, and a free layer including two layers.

FIG. 17 illustrates a scatter plot of GMR versus RA for a sample including a CCP spacer layer including approximately 10 at. % Ag and approximately 90 at. % Al, a CoFe reference layer, and a free layer including a 10 Å layer of 90 at. % Co and 10 at. % Fe and a 35 Å layer of NiFe. The sample was found to have an average GMR of approximately 5% and an average RA of approximately 0.15 $\Omega\mu m^2$.

Figure 18:
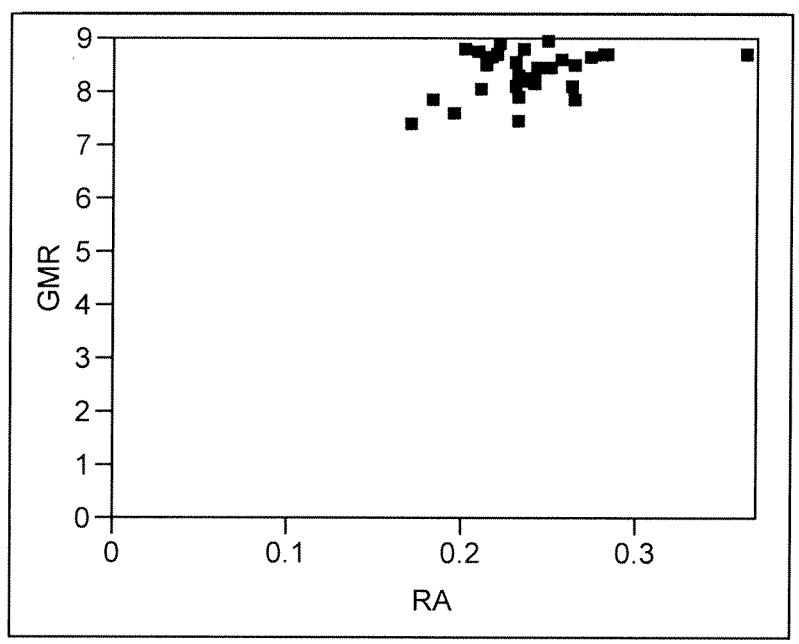
FIG. 18 is a scatter plot of GMR versus RA for a sample including a CCP spacer layer, a CoFe reference layer, and a multilayer free layer.

FIG. 18 is a scatter plot of GMR versus RA for a sample including a CCP spacer layer including approximately 10 at. % Ag and approximately 90 at. % Al, a CoFe reference layer, and a multilayer free layer. The free layer included a 10 Å layer including approximately 50 at. % Co and 50 at. % Fe, a 3 Å layer of Cu, a 10 Å layer including approximately 50 at. % Co and 50 at. % Fe, a 3 Å layer of Cu, and a 10 Å layer including approximately 50 at. % Co and 50 at. % Fe. As FIG. 18 shows, the average GMR of the sample was approximately 8.3%, and the average RA was approximately 0.24 $\Omega\mu m^2$ using the Fe-rich CoFe multi-layer free layer.

Figure 19:
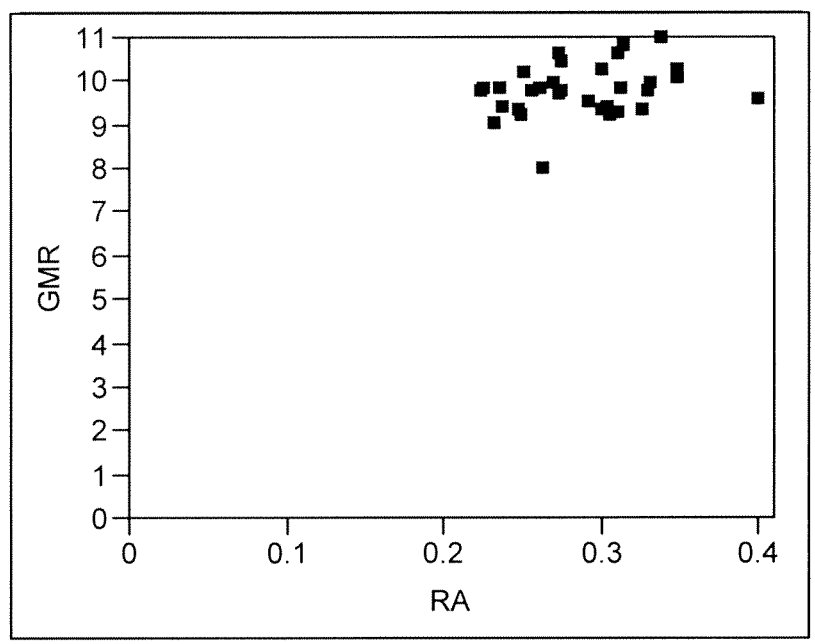
FIG. 19 is a scatter plot of GMR versus RA for a sample including a spacer layer, an Heusler alloy reference layer, and a multilayer free layer.

FIG. 19 is a scatter plot of GMR versus RA for a sample including a spacer layer including approximately 10 at. % Ag and approximately 90 at. % Al, an Heusler-alloy reference layer, and a multilayer free layer including a 10 Å layer including approximately 50 at. % Co and 50 at. % Fe, a 3 Å layer of Cu, a 10 Å layer including approximately 50 at. % Co and 50 at. % Fe, a 3 Å layer of Cu, and a 10 Å layer including approximately 50 at. % Co and 50 at. % Fe. As FIG. 19 shows, an average GMR of approximately 9.7% and an average RA of approximately 0.29 $\Omega\mu m^2$ was achieved using the Heusler alloy reference layer.

Various embodiments of the invention have been described. These and other embodiments are within the scope of the following claims.

The invention claimed is:
1. A sensor comprising a nonmagnetic spacer layer disposed between a magnetically free layer and a reference lamination, the reference lamination comprising Heusler alloy and nonmagnetic metal layers separated from the non- magnetic spacer layer by a first ferromagnetic layer and disposed between the first ferromagnetic layer and a second ferromagnetic layer, the nonmagnetic metal layer comprising Ag and the second ferromagnetic layer contacting the Heusler alloy layer and a nonmagnetic antiferromagnetic spacer layer that separates the second ferromagnetic layer from an antiferromagnetic layer.

2. The sensor of claim 1, wherein the Heusler alloy layer comprises $X_2YZ$, wherein X comprises an element selected from the group consisting of Co, Ir, Rh, Pt, Cu, and combinations thereof, wherein Y comprises an element selected from the group consisting of V, Cr, Mn, Fe, and combinations thereof, and wherein Z comprises an element selected from the group consisting of Al, Si, Ga, Sn, Ge, and combinations thereof.

3. The sensor of claim 1, wherein the Heusler alloy layer comprises $Co_2MnGe$ comprising about 15 at. % to about 40 at. % Mn, about 15 at. % to about 40 at. % Ge, and the balance Co.

4. The sensor of claim 1, wherein at least one of the ferromagnetic layers comprises at least one of CoFe and CoFeB.

5. The sensor of claim 1, wherein at least one of the ferromagnetic layers has a fixed magnetization.

6. The sensor of claim 1, wherein the nonmagnetic metal layer contacts the Heusler alloy and first ferromagnetic layers as part of the reference lamination.

7. The sensor of claim 1, wherein the first ferromagnetic layer comprises a thickness of about 1 Å to about 15 Å.

8. The sensor of claim 1, wherein a synthetic antiferromagnet (SAF) contacts the Heusler alloy layer opposite the first ferromagnetic layer.

9. The sensor of claim 1, wherein the first ferromagnetic layer has a body-centered crystal lattice structure.

10. The sensor of claim 1, wherein the Heusler alloy and first ferromagnetic layers are each tuned with different first and second thicknesses to provide a predetermined amount of inter-diffusion between the Heusler alloy layer and the nonmagnetic spacer layer.

11. A data reader comprising:
a nonmagnetic spacer layer disposed between a magnetically free layer and a reference lamination, the reference lamination comprising Heusler alloy and nonmagnetic metal layers disposed between first and second ferromagnetic layers, the nonmagnetic metal lager comprising Ag and the second ferromagnetic layer contacting the Heusler alloy layer and a nonmagnetic antiferromagnetic spacer layer that separates the second ferromagnetic layer from an antiferromagnetic layer.

12. The data reader of claim 11, wherein the nonmagnetic metal layer contacts the Heusler alloy layer and first ferromagnetic layer as part of the reference lamination.

13. The data reader of claim 11, wherein the reference lamination comprises a portion of a synthetic antiferromagnet (SAF).

14. The data reader of claim 11, wherein the Heusler alloy and first ferromagnetic layers have first and second thicknesses tuned to provide an electron spin polarization of approximately 100%.

15. The data reader of claim 12, wherein the nonmagnetic metal layer has a thickness of approximately 1 A to 15 A.

16. A stack comprising a nonmagnetic spacer layer disposed between a magnetically free layer and a reference lamination, the reference lamination comprising a portion of a synthetic antiferromagnet (SAF), the reference lamination further comprising Heusler alloy and nonmagnetic metal layers disposed between first and second ferromagnetic layers, the nonmagnetic metal layer comprising Ag and the second ferromagnetic layer contacting the Heusler alloy layer and a nonmagnetic antiferromagnetic spacer layer that separates the second ferromagnetic layer from an antiferromagnetic layer.

17. The stack of claim 16, wherein the nonmagnetic antiferromagnetic spacer layer contacts both the second ferromagnetic layer and a pinned layer pinned by the antiferromagnetic layer.

18. The stack of claim 16, wherein the nonmagnetic antiferromagnetic spacer layer comprises Ru.

19. The stack of claim 16, wherein the first and second ferromagnetic layers have magnetizations fixed by the antiferromagnetic layer.

* * * * *

UNITED STATES PATENT AND TRADEMARK OFFICE
CERTIFICATE OF CORRECTION

PATENT NO. : 8,675,319 B2  
APPLICATION NO. : 13/556983  
DATED : March 18, 2014  
INVENTOR(S) : Qing He et al.

Page 1 of 1

It is certified that error appears in the above-identified patent and that said Letters Patent is hereby corrected as shown below:

In the Claims

In Col. 14, Line 2
replace "lager"
with "layer"

Signed and Sealed this
Seventh Day of April, 2015

Michelle K. Lee
*Director of the United States Patent and Trademark Office*